United States Patent [19]
Koglin et al.

[11] Patent Number: 5,534,816
[45] Date of Patent: Jul. 9, 1996

[54] PROGRAMMABLE TRANSDUCER AMPLIFIER CIRCUIT

[75] Inventors: Dennis M. Koglin, Carmel; Mark B. Kearney, Kokomo, both of Ind.

[73] Assignee: Delco Electronics Corporation, Kokomo, Ind.

[21] Appl. No.: 421,956

[22] Filed: Apr. 14, 1995

[51] Int. Cl.$^6$ .................. H01L 35/00; H03K 3/42
[52] U.S. Cl. ............................ 327/513; 327/362
[58] Field of Search ........................... 327/512, 513, 327/378, 362, 306, 560, 561, 562, 563; 330/2, 289

[56] References Cited

U.S. PATENT DOCUMENTS

| | | | |
|---|---|---|---|
| 4,715,003 | 12/1987 | Keller et al. | 364/571 |
| 5,146,788 | 9/1992 | Raynes | 73/708 |
| 5,440,520 | 8/1995 | Schutz et al. | 327/512 |
| 5,451,892 | 9/1995 | Bailey | 327/512 |

Primary Examiner—Toan Tran
Attorney, Agent, or Firm—Jimmy L. Funke

[57] ABSTRACT

In accordance with the teachings of the present invention, a programmable integrated transducer amplifier circuit is provided which receives differential outputs from a transducer, such as a pressure or accelerometer transducer. The programmable integrated transducer amplifier circuit includes binary adjustable circuits that are programmed in response to binary coded signals. The binary adjustable circuits generate binary weighted currents that are employed to adjust the operating characteristics of the amplifier circuit. The binary coded signals are received from a programmable memory array which includes a plurality of memory cells that store binary information. Each of the memory cells are programmed when coupled to a programming signal. Additionally, the memory array has pretest capability for testing outputs of the memory cells prior to permanently programming the respective memory cells. Additionally, the integrated transducer amplifier circuit automatically compensates for variations in the operating temperature of the amplifier circuit. The method of temperature compensation is accomplished by operating the programmable integrated transducer amplifier circuit at a first temperature such that a temperature compensation voltage is "nulled" or is forced to equal zero. Thereafter, the integrated transducer amplifier circuit is operated at other temperatures such that the temperature compensation voltage is generated in a manner representing the difference between the first operating temperatures and the current operating temperature.

23 Claims, 9 Drawing Sheets

PROGRAMMABLE TRANSDUCER AMPLIFIER CIRCUIT

BACKGROUND OF THE INVENTION

1. Technical Field

This invention relates generally to programmable amplifiers and, more particularly, to an integrated transducer amplifier circuit having amplifier characteristics such as gain and offset which may be programmed following final assembly of a packaged sensor.

2. Discussion

Transducers are commonly used to produce an electrical signal in response to a force and may be configured to sense pressure or motion/acceleration, for example. Piezoresistive transducers are conventionally configured with strain sensing circuit elements fabricated on a semi-conductor chip. Since piezoresistive transducers are generally known to produce very small outputs, the transducer outputs typically must therefore be sufficiently amplified. The necessary amplification is usually accomplished with a specialized transducer amplifier.

When amplifying a transducer output, the specialized transducer amplifier realizes certain gain and offset characteristics of the amplifier. It is generally preferred that these amplifier characteristics match those of the transducer element being amplified so as to realize the desired response. In high volume manufacturing applications, it is desired to configure the amplifier so that the amplifier characteristics can be individually adjusted to match the variations present in the transducer element. This is often necessary since variations often do occur over normal manufacturing production runs.

In the past, amplifier characteristics such as gain and offset have been individually calibrated by employing a laser trimming approach. According to this approach, laser trimming resistor elements are carefully trimmed with a laser so as to adjust the resistance value of resistor networks. Alternately, fusible links have also been used to adjust the value of the resistor networks. For motion or pressure sensing transducers, it is sometimes a requirement that the calibration process be performed during the application of the appropriate physical stimulus of motion or pressure. Furthermore, the conventional resistor trimming operation generally requires physical access to the resistors which are otherwise normally enclosed or encapsulated by the final packaged sensor housing. It is therefore required that the laser trimming calibration process be performed prior to the final assembly operations of the sensor and amplifier circuit. The transducer is thereafter fully assembled and then tested. Calibration of an amplifier prior to final assembly usually requires an additional processing step which adds to the overall manufacturing time and cost.

It is therefore desirable to provide a programmable transducer amplifier circuit which may be easily programmed so as to calibrate amplifier characteristics such as gain and offset.

More particularly, it is desirable to provide a programmable transducer amplifier circuit which may be electrically programmable to adjust amplifier characteristics after final assembly of the transducer package and without requiring physical access to assembled components.

It is further desirable to provide for such a programmable transducer amplifier circuit which may be easily programmable via application of electronic signals so as to match gain and offset characteristics to those of the transducer element.

Yet, it is also desirable to provide for such a programmable transducer amplifier circuit and method for programming an amplifier so as to calibrate for characteristics thereof to compensate for changes such as temperature effects.

SUMMARY OF THE INVENTION

In accordance with the teachings of the present invention, a programmable integrated amplifier circuit is provided for achieving calibrated amplifier characteristics such as gain and offset. The programmable integrated amplifier circuit includes an amplifier and binary adjustable circuits for adjusting operating characteristics of the programmable integrated amplifier circuit. The binary adjustable circuits receive a plurality of binary coded signals for independent adjustment of the operating characteristics of the amplifier at a first and at a second operating temperature. The programming of the binary adjustable circuits at the first operating temperature is substantially independent of the programming at the second temperature such that the operating characteristics of the amplifier are independently adjusted.

According to a preferred embodiment, the binary adjustable circuits include a plurality of binary weighted switched current sources which receive the binary coded signals in a manner so as to produce a plurality of adjustable binary weighted currents for adjusting the operating characteristics of the amplifier. These operating characteristics include gain, offset, and temperature compensation. The operating characteristics of the amplifier are advantageously calibrated by applying external inputs to the amplifier circuit without requiring physical access to the assembled circuit. Accordingly, the method of the present invention may be accomplished after final assembly of a packaged transducer and amplifier circuit.

This application is one of two applications filed on the same day, both commonly assigned and having similar specifications and drawings, the other application being identified below:

| U.S. Ser. No. | Title |
| --- | --- |
| 08/422,153 | INTEGRATED TRANSDUCER AMPLIFIER WITH ZENER-ZAP PROGRAMMING |

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
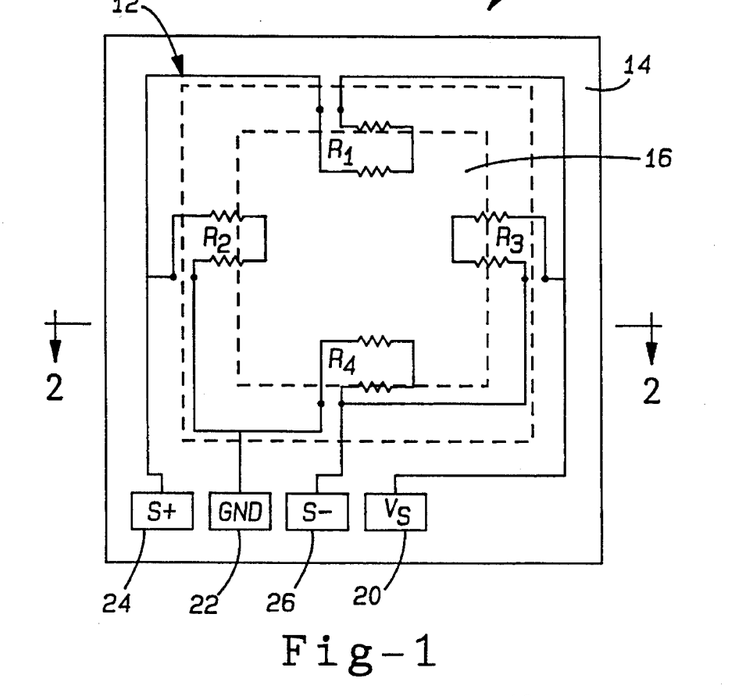
FIG. 1 is a schematic view illustrating a piezoresistive pressure transducer for use with the present invention.
Figures 2, 3:
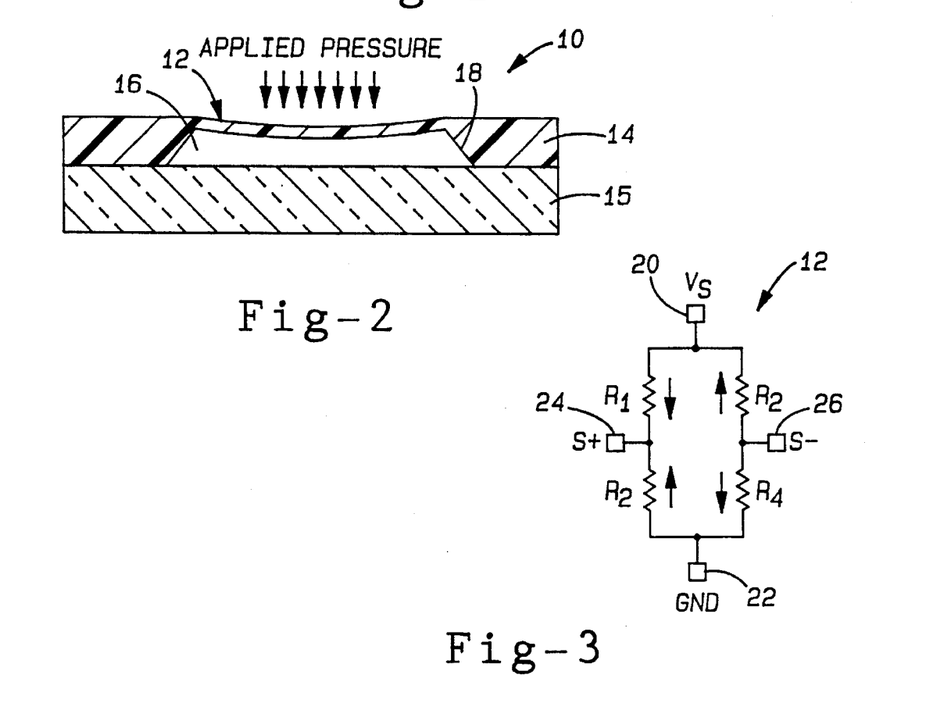
FIG. 2 is a cross-sectional view of the piezoresistive pressure transducer taken through lines 2—2 of FIG. 1.
FIG. 3 is a circuit diagram of a strain sensing circuit employed in the piezoresistive pressure transducer of FIG. 1.

Turning now to FIGS. 1 and 2, a piezoresistive pressure transducer 10 is shown which may be used in connection with the present invention. The piezoresistive pressure transducer 10 has a strain sensing circuit 12 fabricated on top of a flexible dielectric material 14 and configured in an area above a sealed cavity 16. The flexible dielectric material 14 and cavity 16 are provided on top of a rigid support substrate 15. Generally speaking, the piezoresistive pressure transducer 10 is formed on a semi-conductor chip made up of materials 14 and 15. The transducer 10 includes a pair of inputs 20 and 22 for receiving a voltage supply $V_S$ and ground, respectively. Also included are a pair of outputs 24 and 26 for providing a differential output signal as shown by S+ and S−.

The piezoresistive pressure transducer 10 may include a conventional sensing device for measuring a relative amount of pressure that is applied to the strain sensing circuit 12. As pressure is applied on the top surface of the flexible dielectric medium 14, the strain sensing circuit 12 flexes and is therefore subjected to a measurable strain. The strain detection is proportional to the amount of pressure that is applied. Piezoresistive pressure transducers such as transducer 10 are well known in the art and the operation of such transducers should be understood.

The strain sensing circuit 12 is shown in an electrically equivalent form as provided in FIG. 3. More particularly, the strain sensing circuit 12 is shown configured as a wheatstone bridge generally made up of four resistors R1 through R4. Under balanced conditions, the wheatstone bridge preferably exhibits equal value resistance with resistors R1 through R4 and produces a zero differential voltage output. However, when subjected to an amount of strain, the resistive characteristics of the wheatstone bridge change thereby resulting in an unbalanced condition. At the same time, a measurable differential output voltage S+ to S− is produced at outputs 24 and 26. The measured differential output is proportional to an amount of pressure sensed by to the pressure transducer 10.

Figure 4:
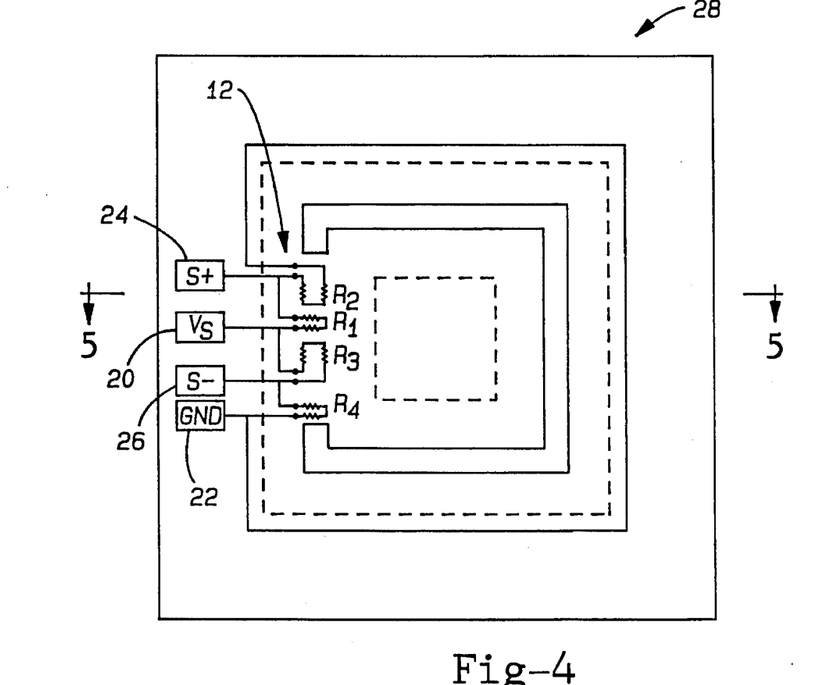
FIG. 4 is a schematic view of a piezoresistive motion/accelerometer transducer for use with the present invention.
Figure 5:
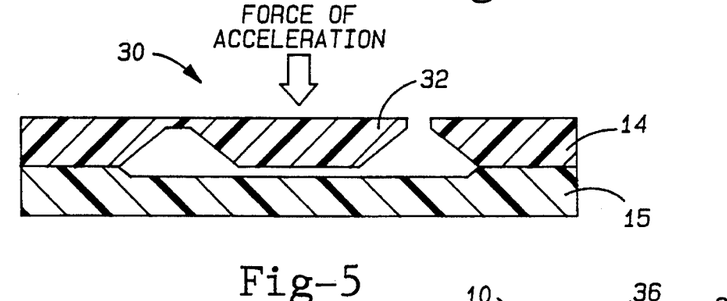
FIG. 5 is a cross-sectional view of the piezoresistive motion/accelerometer transducer taken through lines 5—5 of FIG. 4.

Referring briefly to FIGS. 4 and 5, a piezoresistive accelerometer transducer 28 is shown therein for use with the present invention. The accelerometer transducer 28 similarly includes a strain sensing circuit 12 fabricated on top of a flexible dielectric medium 14 which in turn is fabricated on a rigid support substrate 15. With the accelerometer transducer 28, an amount of acceleration is measured by the strain sensing circuit 12 at a strain measuring location 30. When subjected to acceleration, a proportional amount of force is applied to member 32 which pivots about and causes strain at location 30 of flexible dielectric medium 14. The amount of strain detected with the strain detection circuit 12 is proportional to the amount of acceleration subjected thereto.

With the piezoresistive pressure transducer 10 and piezoresistive accelerometer 28, the output signals S+ and S− produced at respective output lines 24 and 26 are generally known to be very small. Accordingly, the transducer outputs S+ and S− are generally required to be sufficiently amplified to an amplitude that is more easily usable. According to the present invention, a programmable integrated amplifier circuit 36 is assembled and packaged with and connected to a transducer such as piezoresistive transducers 10 or 28.

Figure 6:
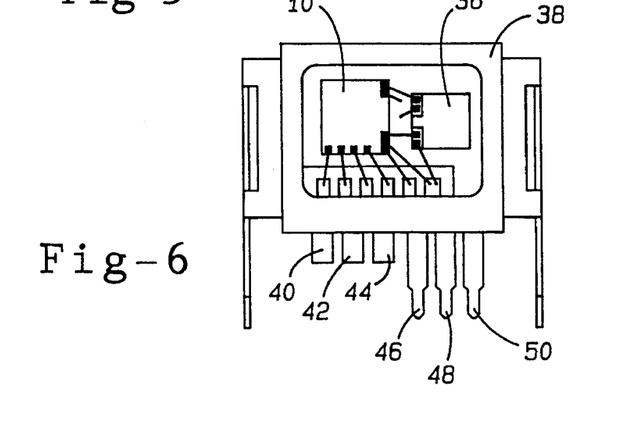
FIG. 6 is a top view of a packaged electronic sensing module containing a piezoresistive transducer and amplifier circuit according to one application of the present invention.

Referring to FIG. 6, a fully packaged electronic sensing module 38 is shown including the piezoresistive transducer 10 and a programmable integrated amplifier circuit 36. The programmable integrated amplifier circuit 36 and transducer 10 are coupled to one another and further coupled to a plurality of standard input and output connectors 40-50. Briefly, connectors 40 and 42 may include addressing decoder inputs, connectors 44 and 46 may be inputs for receiving supply voltage $V_S$ and ground reference, connector 48 may be a programming voltage input, and connector 50 may provide an output for voltage $V_{OUT}$. The programming of the present invention may advantageously be performed on the fully packaged sensing module 38 without requiring physical access to internal components.

Figure 7:
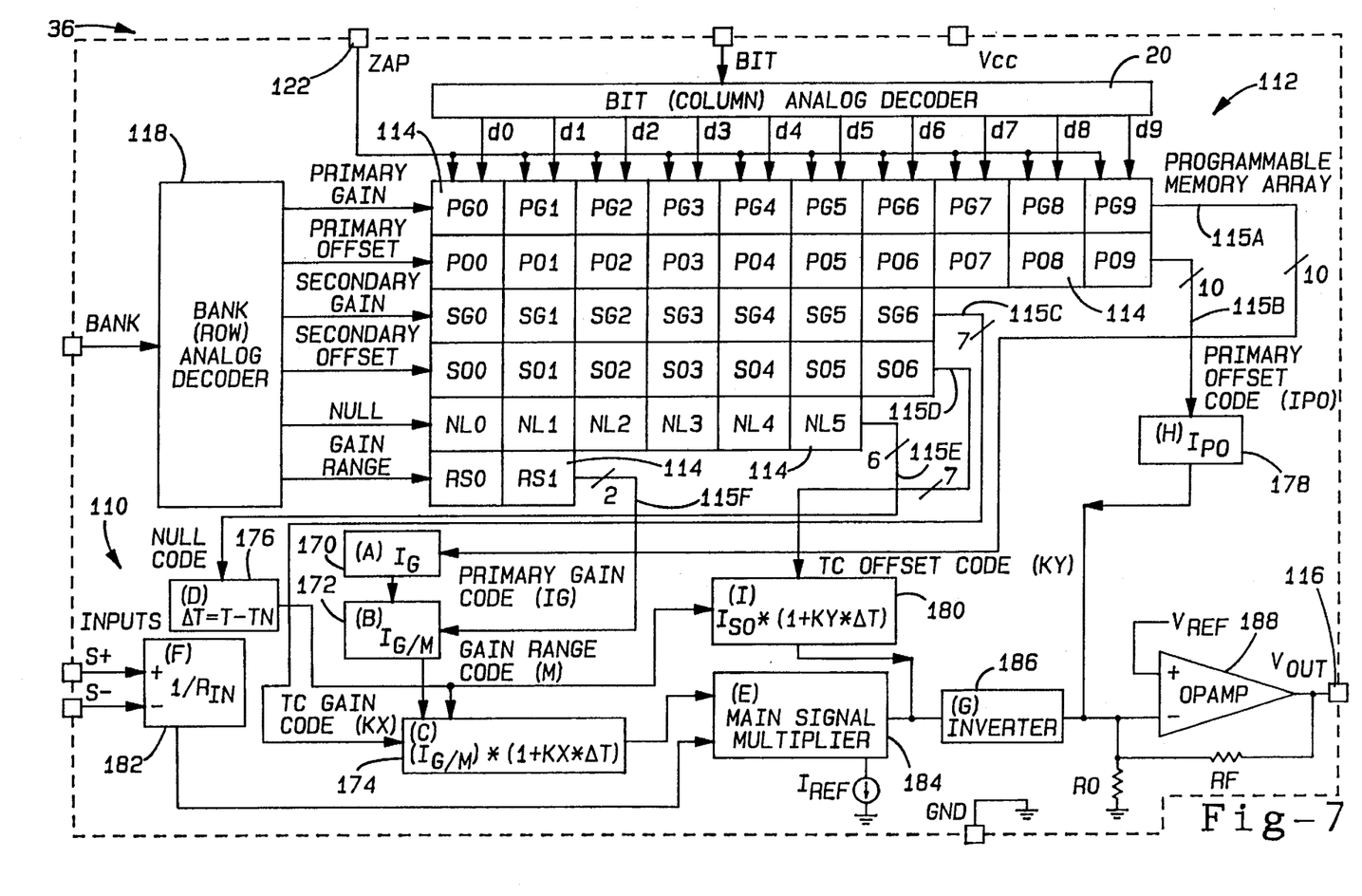
FIG. 7 is a block diagram illustrating the overall programmable transducer amplifier according to the present invention.

Turning now to FIG. 7, the programmable integrated amplifier circuit 36 is shown including calibration circuitry 110. The calibration circuitry 110 is interconnected to an electronically programmable memory array 112 which employs "zener-zap" memory cells 114. Each of the memory cells 114 has an output which in combination provides a digital code in the form of binary bit signals for programming the calibration circuitry 110 via lines 115A–115F. According to the example shown, the calibration circuitry 110 receives differential outputs S+ and S− from a piezoresistive transducer such as pressure transducer 10. As previously mentioned, these transducer outputs S+ and S− are typically very small and require amplification. The calibration circuitry 110 receives the binary bit signals from the memory array 112 and amplifies the transducer outputs S+ and S− such that a compensated calibrated single-ended output voltage $V_{OUT}$ is generated at output line 116.

The calibration circuitry 110 is adapted to be used in a vehicle (not shown), such as an automobile. More particularly, this invention will be described for use in amplifying and conditioning signals from a pressure transducer or a motion/accelerometer transducer or other similar sensing device. However, it is to be understood that the use of this invention is not restricted to automobiles, amplifiers, transducers or sensors, but could have other uses in other applications requiring nonvolatile memory or signal conditioning.

According to the application shown in FIG. 7, each of the memory cells 114 in the electronically programmable memory array 112 are individually addressable via row decoder 118 and column decoder 120. Each of the memory cells 114 receive rows and column address signals from the decoders 118 and 120. When properly addressed, the memory cells 114 can be individually tested and/or programmed so as to provide binary outputs for adjusting initial characteristics, such as gain, offset, and provide temperature compensation, of the programmable integrated amplifier circuit 36. In order to minimize the number of interconnections required for individually testing and/or programming the memory cells 114, each of the memory cells 114 has a common connection to a zap voltage line 122. The zap voltage line 122 is coupled to an external voltage supply (not shown) which provides varying voltage levels via an input connector of amplifier circuit 36.

Figure 8:
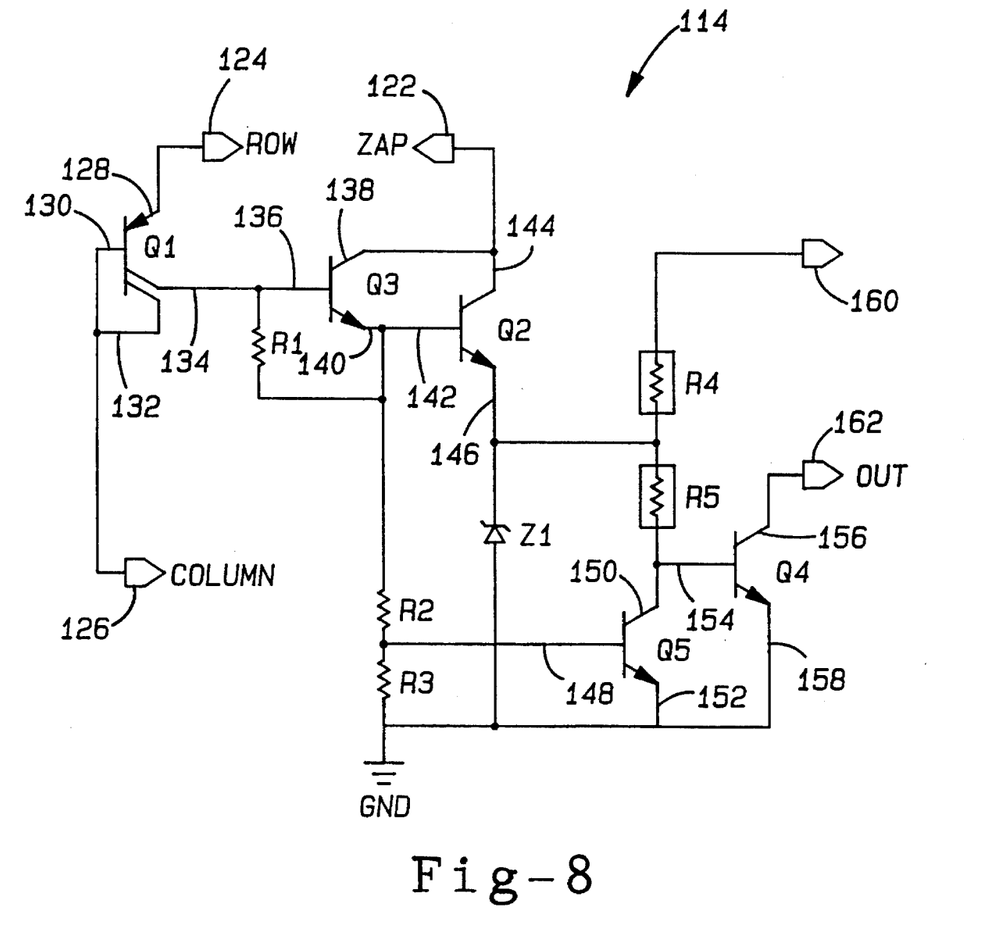
FIG. 8 is a circuit diagram of a "zener-zap" memory cell in accordance with the present invention.

With particular reference to FIG. 8, an individual "zener-zap" memory cell 114 is shown having connections to the zap voltage line 122, a row address line 124, and a column address line 126. Row and column decoders 118 and 120 generate address voltages that are coupled to memory cell 114 via row and column address lines 124 and 126. As illustrated previously in FIG. 7, the zap voltage line 122 is also commonly connected to the other memory cells 114 within the memory array 112. As will be apparent from the discussion below, such a common connection reduces the number of interconnections required for testing and programming the memory cells 114 within the memory array 112.

Memory cell 114 includes transistors Q1, Q2, Q3, Q4, and Q5. Transistor Q1 is preferably a PNP configured bipolar transistor, and transistors Q2–Q5 are preferably NPN configured bipolar transistors. Transistor Q1 has an emitter 128, a base 130, a first collector 132, and a second collector 134. Row address line 124 is coupled to the emitter 128 of transistor Q1, and column address line 126 is coupled to both the base 130 and the collector 132 of transistor Q1. Transistor Q3 has a base 136, which is coupled to the collector 134 of transistor Q1, a collector 138, and an emitter 140. The collector 138 of transistor Q3 is coupled to the zap voltage line 122. Resistor R1 is coupled between the base 136 and the emitter 140 of transistor Q3. The emitter 140 of transistor Q3 is coupled to ground (GND) by resistors R2 and R3. Resistors R1, R2 and R3 each preferably have resistances of 25K ohms. Transistor Q2 has a base 142, which is coupled to the emitter 140 of transistor Q3, a collector 144, and an emitter 146. The collector 144 of transistor Q2 is connected to the zap voltage line 122. The emitter 146 of transistor Q2 is connected to the cathode of zener diode Z1 which, in turn, is coupled to ground (GND). Transistor Q5 has a base 148, which is coupled between resistors R2 and R3, a collector 150, and an emitter 152. Transistor Q4 has a base 154, a collector 156, and an emitter 158. The collector 150 of transistor Q5 and the base 154 of transistor Q4 are commonly coupled to a direct current (DC) voltage supply 160 through resistors R4 and R5. The emitter 152 of transistor Q5 and the emitter 158 of transistor Q4 are both coupled to ground. Direct current voltage supply 160 preferably supplies a bias voltage of +2.5 volts. As with the zap voltage line 122, voltage supply 160 is commonly connected to all of the memory cells 114 within memory array 112. Additionally, the emitter 146 of transistor Q2 is coupled to voltage supply 160 through resistor R4. Resistor R4 preferably has a resistance of 150K ohms, and Resistor R5 preferably has a resistance of 25K ohms. The memory cell output line 162 is coupled to the collector 156 of transistor Q4. As will be discussed more fully below, transistor Q4 reads the status of zener diode Z1, and provides an output response at output line 162 that is dependent on the status of zener diode Z1.

In operation, the "zener-zap" memory cell 114 is addressed when a "high" signal is applied to row address line 124 and a "low" signal is applied to column address line 126. The "high" signal is preferably a +5 volt supply, and the "low" signal is a voltage for extracting a sufficiently large current from the column address line 126 for driving the base 136 of transistor Q3. This causes transistor Q1 to "turn on" such that current is conducted through the collector 134 for driving the base 136 of transistor Q3. Once the memory cell 114 has been properly addressed, the zener diode Z1 can be permanently programmed through the application of a programming voltage to zener diode Z1 such that a programmed binary signal is generated at the output line 162, or the memory cell 114 can be tested without permanently programming zener diode Z1 so as to generate the same programmed binary signal at the output line 162. In either situation, the programmed binary signal is supplied to the calibration circuitry 110 via lines 115A–115F for digital calibrating purposes which will be discussed in detail hereinafter. Thus, the effects that the testing and/or programming of zener diodes Z1 have on calibration circuitry 110 and on output voltage $V_{OUT}$ may be monitored at output line 116.

Next, the method of programming the zener diode Z1 will now be discussed in detail in accordance with a preferred embodiment of the invention. Assuming that the memory cell 114 has been properly addressed via row and column address lines 124 and 126, the zener diode Z1 is permanently programmed when it is coupled to a programming voltage that is several volts higher than the reverse breakdown voltage of the zener diode Z1. This programming voltage, preferably set at a +25 volt level, is applied to zap voltage line 122 and row address line 124. When transistor Q1 is properly addressed, the current conducted through the collector 134 of transistor Q1 drives the base 136 of transistor Q3, causing transistor Q3 to "turn on" such that current is conducted through the emitter 140. The current conducted through the emitter 140 of transistor Q3 drives the base 142 of transistor Q2, causing transistor Q2 to "turn on" such that current is conducted through the emitter 146. With transistor Q2 "turned on", the programming voltage, which has been applied to the zap line 122, is coupled by transistor Q2 to zener diode Z1 such that zener diode Z1 is electrically overstressed and operating in the avalanche region. The coupling of the programming voltage to zener diode Z1 and resulting current programs zener diode Z1 such that it functions as a low impedance shunt to ground for the current provided from voltage supply 160 through resistor R4. This results in the base 154 of transistor Q4 being held "low", keeping transistor Q4 "turned off" such that current is not conducted through transistor Q4. As will be apparent to one skilled in the art, this causes transistor Q4 to operate as an open circuit and provide a programmed binary output for the circuitry coupled to the output line 162. In accordance with the application shown in FIG. 7, this programmed binary output signal is applied to calibration circuitry 110 for purposes of digitally calibrating the calibration circuitry 110 which, in turn, effects output voltage $V_{OUT}$.

Next, the pretest capability of the memory cell 114 will be discussed in accordance with a preferred embodiment of the invention. Again, assuming that the memory cell 114 has been properly addressed via row and column address lines 124 and 126, the resulting output that would be realized from permanently programming zener diode Z1 may be non-destructively tested prior to actually programming zener diode Z1 by the programming method discussed above. This pretest capability is accomplished by applying a pretest voltage that is at an intermediate potential level which is preferably greater than zero but less than the reverse breakdown voltage of zener diode Z1 to the zap line 122. The programming voltage is preferably set at a +5 volt level.

As discussed in detail above in conjunction with the programming of the zener diode Z1, the current conducted through collector 134 of transistor Q1 drives the base 136 of transistor Q3, causing transistor Q3 to "turn on". Current from the emitter 140 of the transistor Q3 drives the base 142 of transistor Q2, causing transistor Q2 to "turn on". Again, transistor Q2 couples the voltage applied to the zap voltage line 122 to the zener diode Z1. However, when the lower voltage level pretest voltage is applied to the zap voltage line 122, the current conducted by transistor Q2 is blocked by zener diode Z1 because the reverse breakdown voltage of the zener diode Z1 is not exceeded. Therefore, the current conducted from the zap voltage line 122 flows through the emitter 146 of transistor Q2 to the resistor R5. As will be apparent, the current conducted through collector 134 of transistor Q1 is coupled to the base 148 of transistor Q5 through resistor R1 and resistor R2, causing transistor Q5 to "turn on". Thus, the current flowing through resistor R5 is coupled to ground by transistor Q5. Because transistor Q5 has been "turned on", the base 154 of transistor Q4 is held "low", keeping transistor Q4 "turned off" such that transistor Q4 does not conduct current. As a result, transistor Q4 operates as an open circuit and provides the same programmed binary output at output line 162 as if zener diode Z1 had been previously programmed. This pretest capability enables the memory cell 114 to be tested such that the programmed binary output is reflected at output line 162 prior to permanently programming zener diode Z1. Therefore, the effects on calibration circuitry 110 and resulting output voltage $V_{OUT}$ that would be realized by programming memory cell 114 can be monitored prior to permanently programming zener diode Z1.

The programming and pretest methods discussed in connection with memory cell 114 may be subsequently repeated in order to test and selectively program other memory cells within memory array 112. By selectively testing particular memory cells within memory array 112, the effects that would be realized from programming the particular memory cells may be monitored through the changes in voltage $V_{OUT}$ at output line 116 of calibration circuit 110. Therefore, the individual memory cells 114 are tested and programmed so as to provide a desired voltage $V_{OUT}$ at output line 116.

After memory cell 114 has been tested and/or programmed in accordance with the methods set forth above, transistor Q4 reads the status of zener diode Z1, and provides a binary signal at the output line 162 that is dependent on the status of zener diode Z1. During this post-testing and programming phase, a "low" voltage which is at a level close to ground potential is applied to zap voltage line 122. Therefore, if the zener diode Z1 has not been previously programmed by the application of the programming voltage to zener diode Z1, current supplied by voltage supply 160 through resistors R4 and R5 will drive the base 154 of transistor Q4, causing transistor Q4 to "turn on". As should become apparent to one skilled in the art, transistor Q4 will then operate as a short circuit to ground and provide a binary output reflecting the same for calibration circuitry 110 which is coupled to the output line 162. On the other hand, if zener diode Z1 has been programmed by the application of the programming voltage to zener diode Z1, current supplied by voltage supply 160 through resistor R4 will be coupled to ground by zener diode Z1 which functions as a low impedance shunt to ground. Therefore, the base 154 of transistor Q4 will be held "low" and transistor Q4 will then operate as an open circuit and provide a binary output reflecting the same for calibration circuitry 110. In accordance with the application shown in FIG. 7, the binary output read by transistor Q4 is coupled to the calibration circuitry 110 for digital calibrating purposes.

Referring again to FIG. 7, the overall programmable integrated amplifier circuit 36 is shown. As discussed above, when properly tested and programmed, the memory array 112 supplies the calibration circuitry 110 with a plurality of binary coded signals supplied via lines 115A–115F for adjusting the operating characteristics of the programmable integrated amplifier circuit 36. Each of lines 115A–115F, while illustrated as a single line, represents a plurality of lines that are coupled to each of the respective memory cells 114 in a given row of the memory array 112. For example, line 115A has ten lines which may be employed and are coupled to ten memory cells PG0 through PG9.

The calibration circuitry 110 includes a primary gain code block 170 which receives primary gain code binary signals from memory cells PG0 through PG9 via lines 115A. A gain range code block 172 receives gain range code binary signals from memory cells RS0 and RS1 via lines 115F. A secondary gain code block 174 receives TC gain code binary signals from memory cells SG0 through SG6 via lines 115C. Similarly, a temperature compensation null code block 176 receives null code binary signals from memory cells NL0 through NL5 via lines 115E. A primary offset code block 178 receives primary offset code binary signals from memory cells PO0 through PO9 via lines 115B. A secondary offset code block 180 receives TC offset code binary signals from memory cells S00 through S06 via lines 115D. It will be apparent that each of the aforementioned blocks 170–180 may use any number of the memory cells 114 of a respective row of the memory array 112.

The calibration circuitry 110 also includes a voltage to current converter block 182 which receives the transducer outputs S+ and S− from the transducer 10 and converts the differential voltage as received to a current. A main signal multiplier block 184 and an inverter block 186 feed an inverting (−) input of an operational amplifier 188. The inverting input (−) of operational amplifier 188 is coupled to ground via a resistor RO and is also coupled to the output 116 via resistor RF. The operational amplifier 188 further includes a non-inverting input (+) for receiving a reference voltage $V_{REF}$. In effect, gain and offset of the operational amplifier 188 are established via control of the inverting (−) input.

In operation, the programmable integrated amplifier circuit 36 is programmed at a first operating temperature $T=T_1$ in order to realize a compensated calibrated single-ended output voltage $V_{OUT}$ at output line 116 which represents a given differential voltage input from transducer 10. The transducer 10 is also operated at the first operating temperature $T=T_1$. The voltage to current converter block 182 receives the differential outputs S+ and S− from the transducer 10 and converts the differential voltage received to a current. In order to compensate for effects due to temperature variations, the temperature compensation null code block 176 generates an output voltage $V_T$ as is described later hereinafter.

The change temperature ΔT may be represented by ΔT=T−T$_N$ which defines the difference between an operating temperature T and a null temperature T$_N$. By programming the temperature compensation null code block 176 with the null code binary signals, the null co-efficient T$_N$ may be adjusted to equal the operating temperature T such that ΔT equals zero. Thereafter, with changes in the operating temperature T, the output voltage V$_T$ will vary as a function of ΔT and will have a value that changes proportionally with the changes in the operating temperature T.

Also, while operating at the initial operating temperature, the primary gain code block 170 receives primary gain code binary signals from the memory cells PG0 through PG2 in order to generate an adjustable primary gain current I$_G$ which is passed to the gain range code block 172. The gain range code block 172 is programmed by the gain range code binary signal received from memory cell RS0 in order to select a gain range for the primary gain current that may be represented by I$_G$/M. The primary gain current I$_G$/M is then passed to the secondary gain code block 174. The secondary gain code block 174 also receives the output voltage V$_T$ from the temperature compensation null code block 176. Because the programmable integrated amplifier circuit 36 is being operated at the first operating temperature T=T$_1$, the output voltage V$_T$ from the temperature compensation null code block 176 is programmed so as to "null" ΔT or cause ΔT to equal zero. Therefore, this "nulls" any secondary gain current, which may be represented by (1+KX*ΔT), that the secondary gain code block 174 may generate for adjusting the operating characteristics of the integrated amplifier circuit 36. As will become apparent to one skilled in the art, the primary gain current, represented by I$_G$/M, generated by the primary gain code block 170 and the gain range code block 172 adjusts the operating characteristics of the programmable integrated amplifier circuit 36 in a manner that is independent of the operating temperature of the integrated amplifier circuit 36. In contrast, the secondary gain current, which may be represented by (1+KX*ΔT), that the secondary gain code block 174 generates for adjusting the operating characteristics of the programmable integrated amplifier circuit 36 is temperature dependent due to the output voltage V$_T$ received from the temperature compensation null code block 176.

At the first operating temperature T=T$_1$, the primary gain current I$_G$/M is passed to the main signal multiplier block 184 and is divided by current source I$_{REF}$ to complete the adjustable primary gain current supplied to the inverting (−) input of the operational amplifier 188. The resistor R$_F$ and the operational amplifier 188 convert this main signal current to a voltage which may be monitored at output line 116.

While still operating at the first operating temperature T=T$_1$, the primary offset code block 178 receives primary offset code binary signals from the memory cells PO0 through PO2 in order to generate a primary offset current I$_{PO}$ which is coupled to the inverting (−) input of the operational amplifier 188. The secondary offset code block 180 receives the output voltage V$_T$ from the temperature compensation null code block 176 which, in turn, "nulls" any scaling of the secondary offset current, which may be represented by I$_{SO}$*(1+KY*ΔT), generated by the secondary offset code block 180. As will be apparent to one skilled in the art, the primary offset current, I$_{PO}$, generated by the primary offset code block 178, adjusts the operating characteristics of the integrated amplifier circuit 36 in a manner that is independent of the operating temperature of the integrated amplifier circuit 36. In contrast, the secondary offset current generated by the secondary offset code block 180 is temperature dependent due to the output voltage V$_T$ received from the temperature compensation null code block 176.

In order to properly program and compensate for signal variations due to changes in the operating temperature of the integrated amplifier circuit 36 and the transducer 10, the programmable integrated amplifier circuit 36 is programmed at a second operating temperature in order to realize the same compensated calibrated single-ended output voltage V$_{OUT}$ at the output line 116 that was generated at the first operating temperature T=T$_1$. At this second operating temperature, the output voltage V$_T$ from the temperature compensation null code block 176 is now at a non-zero voltage level which represents the difference between the first operating temperature T, which was a null temperature T$_N$, and the current operating temperature.

The secondary gain code block 174 and the secondary offset code block 180 receive the non-zero output voltage V$_T$ such that the secondary gain current and the secondary offset current I$_{ST}$ exiting secondary offset code block 180 are no longer "nulled". Therefore, the secondary gain code block 174 may now be selectively programmed by receiving the TC gain code binary signals from memory cells SG0 through SG6 via lines 115C in order to scale the primary gain control current by a desired amount. This scaling may be represented by the term (1+KX*ΔT). Likewise, the secondary offset code block 180 may now be selectively programmed by receiving the TC offset code binary signals from memory cells S00 through S02 via lines 115D in order to scale the secondary offset current. As such, the selective programming of the secondary gain code block 174 and the secondary offset code block 180 at the second operating temperature allows the operating characteristics of the programmable integrated amplifier circuit 36 to be adjusted until the output voltage V$_{OUT}$ at output 116 preferably exhibits the same operating characteristics realized at the first operating temperature T=T$_1$.

Figure 9:
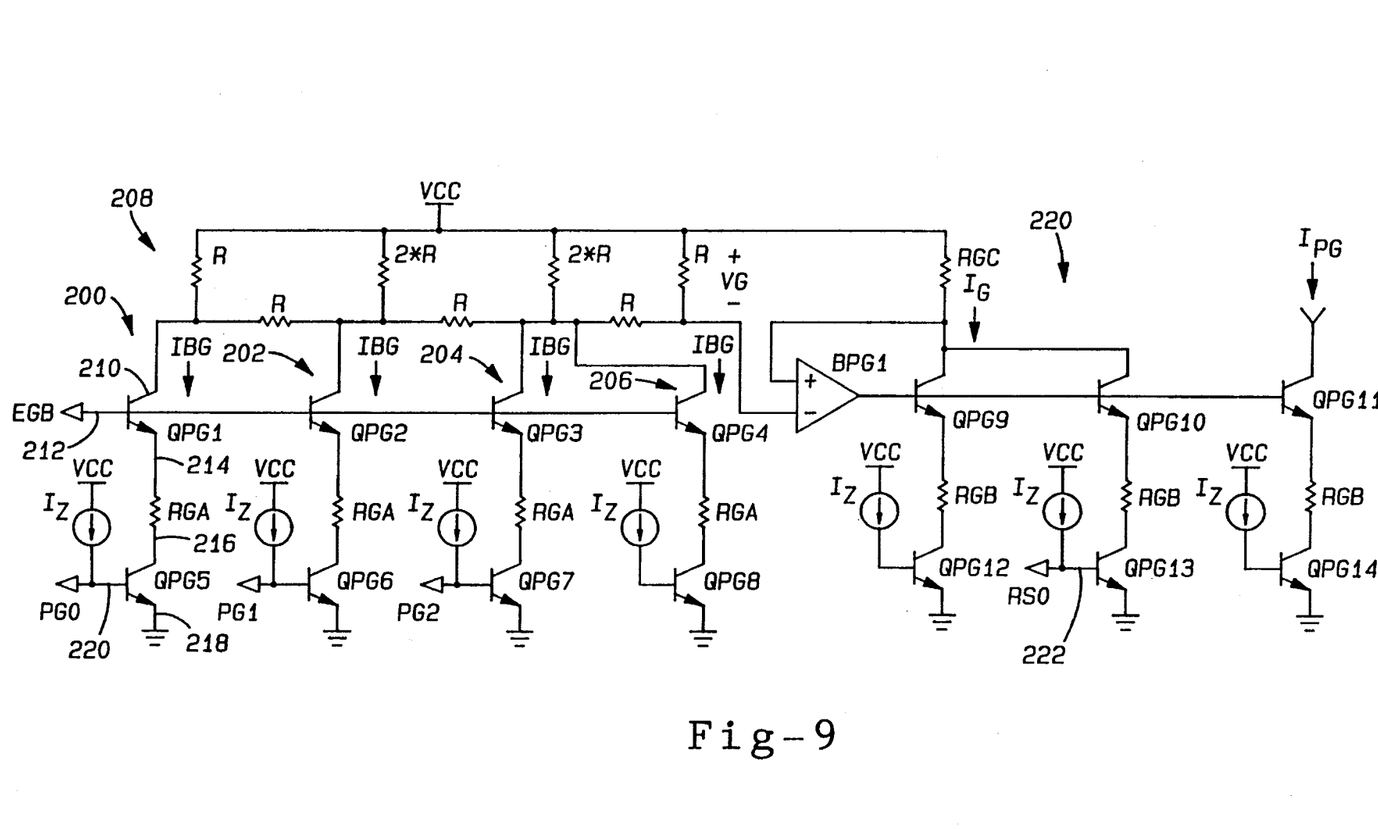
FIG. 9 is a circuit diagram illustrating the circuitry contained in blocks (A) and (B) of FIG. 7 in accordance with the present invention.

Turning to FIG. 9, the circuitry employed in the primary gain code block 170 and the gain range code block 172 is illustrated. Additionally, the primary gain current I$_G$ and the resulting primary gain current I$_{PG}$ exiting the gain range block 172 is illustrated. The primary gain current I$_G$ is an adjustable binary weighted current. The primary gain current I$_G$ represents the summed current generated by parallel binary weighted switched current sources 200, 202, 204, and 206. According to a preferred embodiment, each of the parallel binary weighted switched current sources 200–206 conducts an equal amount of current I$_{BG}$. Each of the binary weighted switched current sources 200–206 are coupled to and supply equal amounts of current, I$_{BG}$, to a R-2R resistor network 208 to provide for binary weighting of the primary gain current I$_G$ and the resulting primary gain current I$_{PG}$. The R-2R ladder 208 is a conventional network employing resistors with resistances equalling R and 2*R. Each of the binary weighted switched current sources 200–206 includes corresponding elements which will now be described with reference to the binary weighted switched current source 200. The binary weighted switched current source 200 includes transistor QPG1 and transistor QPG5 which are coupled by a resistor RGA. The collector 210 of transistor QPG1 is coupled to the R-2R resistive network 208 for sourcing the current I$_{BG}$. The base 212 of transistor QPG1 is coupled to a bias voltage source EGB. The emitter 214 of transistor QPG1 is coupled to resistor RGA which in turn is coupled to the collector 216 of transistor QPG5. The emitter 218 of transistor QPG5 is coupled to ground. The base 220 of transistor QPG5 is coupled to a current source I$_Z$ which in turn is coupled to a bias voltage Vcc. A programmable input PG0 is also coupled to the base 220 of transistor QPG5. The other binary switched current sources 202–206 similarly include corresponding elements, with programmable inputs PG1 and PG2 coupled to binary weighted switched current sources 202 and 204, respectively. The programmable inputs PG0–PG2 receive the primary gain code binary signals from the memory cells PG0–PG2 via lines 115A. In order to adjust current $I_G$ in a binary manner, memory cells PG0–PG2 may be selectively tested and programmed in accordance with the aforementioned zener zap memory testing and programming procedure. For example, when memory cell PG0 has been tested and/or programmed, an open circuit is reflected at programmable input PG0 of the binary weighted switched current source 200 such that the current $I_Z$ is sourced to the base 220 of transistor QPG5. This "turns on" transistor QPG5 such that current $I_{BG}$ is sourced through transistor QPG1, resistor RGA, and transistor QPG5 to ground. On the other hand, if the memory cell PG0 has not been programmed, a short circuit to ground will be reflected at programmable input PG0 such that the current $I_Z$ is not coupled to the base 220 of transistor QPG5. Therefore, transistor QPG5 does not "turn on" and the current $I_{BG}$ is not sourced to ground. As will be apparent to one skilled in the art, the binary weighted switched current sources 202 and 204 likewise operate in a similar manner when programmable inputs PG1 and PG2 are programmed.

The primary gain current $I_G$ may be programmed in response to binary programmable inputs PG0, PG1 and PG2 and may be expressed by the following equation:

$$I_G=(R/RGC)*(IBG/3)*(1+PG2+PG1/2+PG0/4),$$

where PG0–PG2 represent a binary value of "1" if a respective memory cell has been programmed and represents a binary value of "0" if the respective memory cell has not been programmed. Therefore, as will be apparent to one skilled in the art, the primary gain current $I_G$ may be weighted in a binary manner via the selective programming of respective memory cells.

Transistors QPG9–QPG14 and resistors RGB are connected so as to provide a programmable current mirror 220. The operation of the current mirror 220 depends upon the programming status of programmable input RS0 which receives a gain range code binary signal from the memory cell RS0 via lines 115F. The operation of transistor QPG13 is substantially the same as the operation of transistor QPG5. If an open circuit is reflected by the memory cell RS0 to the programmable input RS0, the current source $I_Z$ will be applied to the base 222 of transistor QPG13. This "turns on" transistor QPG13. In contrast, if a short to ground is reflected at programmable input RS0, the current source $I_Z$ is not coupled to the base 222 of transistor QPG13 such that transistor QPG13 does not "turn on". Therefore, if programmable input RS0 is shorted to ground, the primary gain current $I_G$ will directly mirror to transistor QPG11. If an open circuit is reflected to the programmable input RS0, the primary gain current $I_G$ will be divided by a factor of two and then be mirrored to transistor QPG11. Therefore, the gain range of the resulting primary gain current $I_{PG}$ may be adjusted in a binary fashion. The resulting primary gain current $I_{PG}$ may be represented by the following equation:

$$I_{PG}=[R/(RGC*(1+RS0))]*(IBG/3)*(1+PG2+PG1/2+PG0/4).$$

Figure 10:
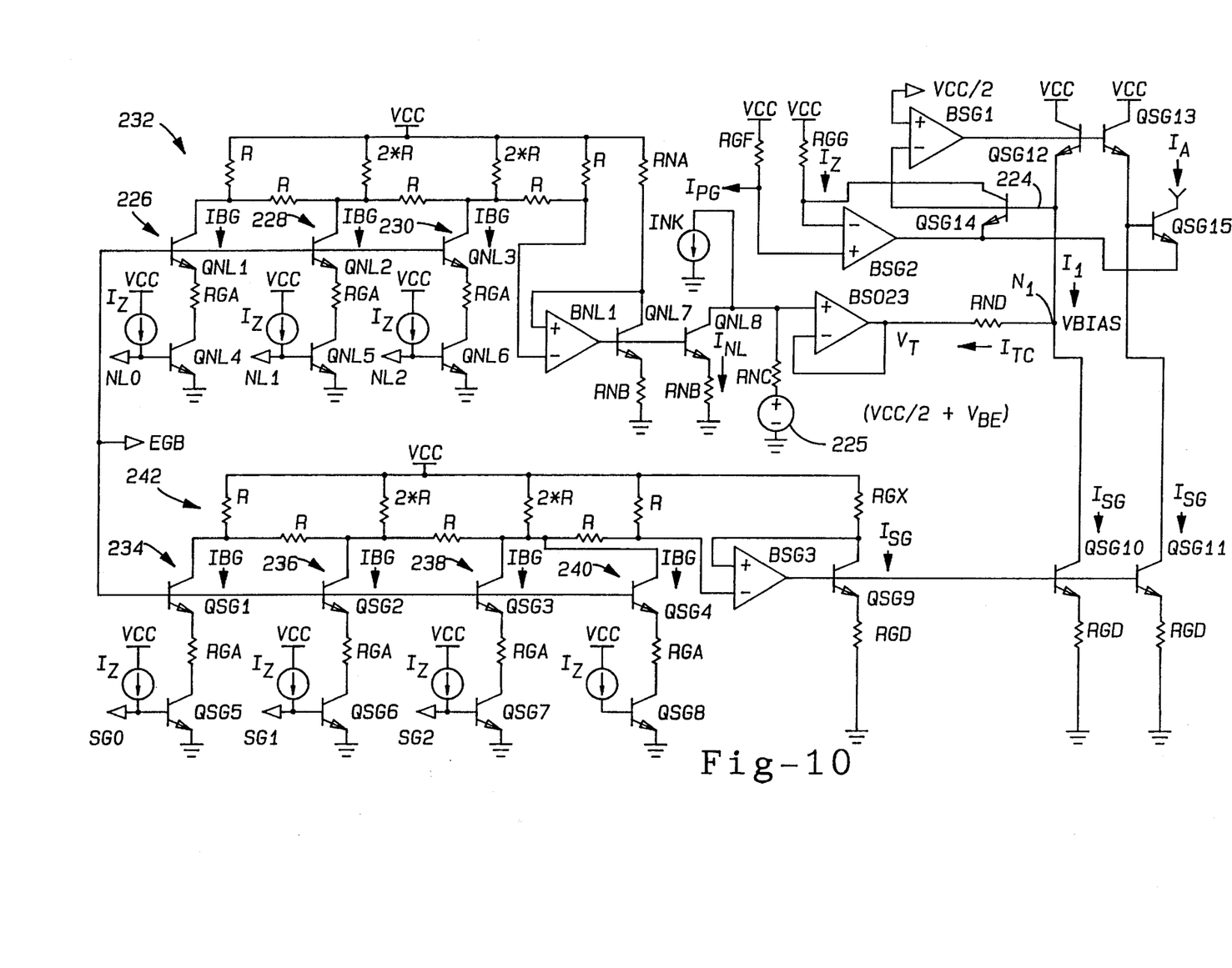
FIG. 10 is a circuit diagram of the circuitry contained in blocks (C) and (D) of FIG. 7 in accordance with the present invention.

Turning to FIG. 10, the circuitry contained within the secondary gain code block 174 and the temperature compensation null code block 176 is illustrated. The transistors QSG12 through QSG15 form a secondary gain multiplier of secondary gain code block 174 which produces an output current $I_A$. Output current $I_A$ is the current exiting the secondary gain code block 174. The resulting primary gain current $I_{PG}$ is mirrored by the operational amplifier BSG2 together with resistors RGF and RGG which are coupled to voltage supply Vcc to form current $I_2$. Current $I_2$ may be represented by the following equation:

$$I_2=RGF*I_{PG}/RGG.$$

The operational amplifier BSG1 has a noninverting input (+) coupled to a voltage Vcc/2 which forces the base 224 of transistor QSG14 to voltage Vcc/2 and in turn forces node N1 to equal a voltage of Vcc/2. The output voltage of the temperature compensation null block 176 is represented by voltage $V_T$ as shown at the output of an operational amplifier BSO23. Therefore, the current $I_{TC}$ through resistor RND may be represented by the following equation:

$$I_{TC}=(Vcc/2-V_T)/RND,$$

The voltage $V_T$ is developed from a temperature dependent voltage source 225 which has a preferred value of (VCC/2+$V_{BE}$) and supplies a voltage across a resistor RNC. The voltage $V_{BE}$ represents the forward voltage drop of a silicon diode (not shown). The diode voltage drop $V_{BE}$ has a temperature dependence of approximately –2 mV/°C. A more detailed description of the temperature dependent voltage source 225 with temperature dependent diodes is provided in co-filed Application Serial No. D.E. No. H-188708 titled "Temperature Dependent Voltage Generator with Binary Adjustable Null Voltage", and which is incorporated herein by reference. The linear temperature response of voltage $V_{BE}$ may be presented by:

$$V_{BE}=E_{G0}-K_0T/T_0,$$

which is a simplified equation showing the temperature dependence of a silicon diode with respect to temperature T. Therefore, $V_T$ may now be expressed as:

$$V_T=Vcc/2+E_{G0}-K_0T/T_0-RNC*(I_{NL}+I_{NK}).$$

Thus, substituting $V_T$ in the above equation for current $I_{TC}$, the current $I_{TC}$ may now be represented by:

$$I_{TC}=[RNC*(I_{NL}+I_{NK})+T*K_0/T_0-E_{G0}]/RND.$$

The current $I_{NL}$ is an adjustable binary weighted current which represents the current generated by parallel binary weighted switched current sources 226, 228 and 230. The parallel binary weighted switched current sources 226–230 include transistors QNL1–QNL6 and resistors RGA. Each of the parallel binary weighted switched current sources 226–230 conducts an equal current $I_{BG}$. Additionally, each of the binary weighted switched current sources 226–230 are coupled to an R-2R resistor network 232 to provide for binary adjustment of the current $I_{NL}$. As will be apparent to one skilled in the art, binary switched current sources 226–230 operate in substantially the same manner as binary weighted switched current sources 200–206 of FIG. 9. The difference being that the bases of transistors QNL4–QNL6 include programmable inputs NL0–NL2. In order to adjust current $I_{NL}$ in a binary manner, memory cells NL0–NL2 are selectively programmed in accordance with the aforementioned memory programming process in order to source the currents $I_Z$. When operating at the first operating temperature T=T₁, the null code binary signals provided to programmable inputs NL0–NL2 selectively adjust the current $I_{NL}$ until current $I_{TC}$ is "nulled" or forced to equal zero. Thereafter, when the operating temperature changes from the first operating temperature T, the current $I_{TC}$ may be represented by the following equation:

$$I_{TC}=K_0*(T-TN)/(RND*T_0),$$

where (T−TN) or ΔT represents the different in operating temperature from the first operating temperature T.

The current $I_A$ exiting the secondary gain code block 174 may be represented by the following equation:

$$I_A/I_{REF}=(RGF/RGG)*(I_{PG}/I_{REF})*[1+K_0*\Delta T/(I_{SG}*RND*T_0)],$$

where $K_0/(I_{SG}*RND*T_0)$ equals KX as shown in secondary gain code block 174. As discussed above, at the first operating temperature T=T₁, primary gain current $I_{PG}$ is adjusted via programmable inputs PG0–PG2 and output voltage $V_T$ equals $V_{BIAS}$ (i.e., "nulled"). Voltage $V_T$ set equal to $V_{BIAS}$ is indicative of ΔT being equal to zero. Therefore, the equation for $I_A/I_{REF}$ is independent of the secondary gain current $I_{SG}$ due to voltage $V_T$ being "nulled".

When operating at a second temperature, the secondary gain current $I_{SG}$ represents the current generated by parallel binary weighted switched current sources 234, 236, 238, and 240. Each of the binary weighted switched current sources 234–240 are coupled to an R-2R resistor network 242 to provide for binary adjustment of the secondary gain current $I_{SG}$. As will be apparent to one skilled in the art, each of the binary weighted switched current sources 234–240 operates in a manner substantially the same as the binary weighted switched current sources 200–206 of FIG. 9. The binary weighted switched current sources 234–240 include transistors QSG1–QSG8 and resistors RGA. Each of the binary weighted switched current sources 234–238 includes respective inputs SG0, SG1 and SG2 which in turn receive the TC gain code binary signals from memory cells SG0–SG2. Therefore, the secondary gain current $I_{SG}$ may be weighted in a binary manner in response to selective programming of the respective memory cells SG0–SG2 in order to source the currents $I_Z$. Therefore, at the second operating temperature, current $I_{SG}$ is weighted in a binary fashion in order to selectively adjust the current $I_A$ exiting secondary gain code block 174 in a temperature dependent manner without changing the value of the gain at the first temperature T.

Figure 11:
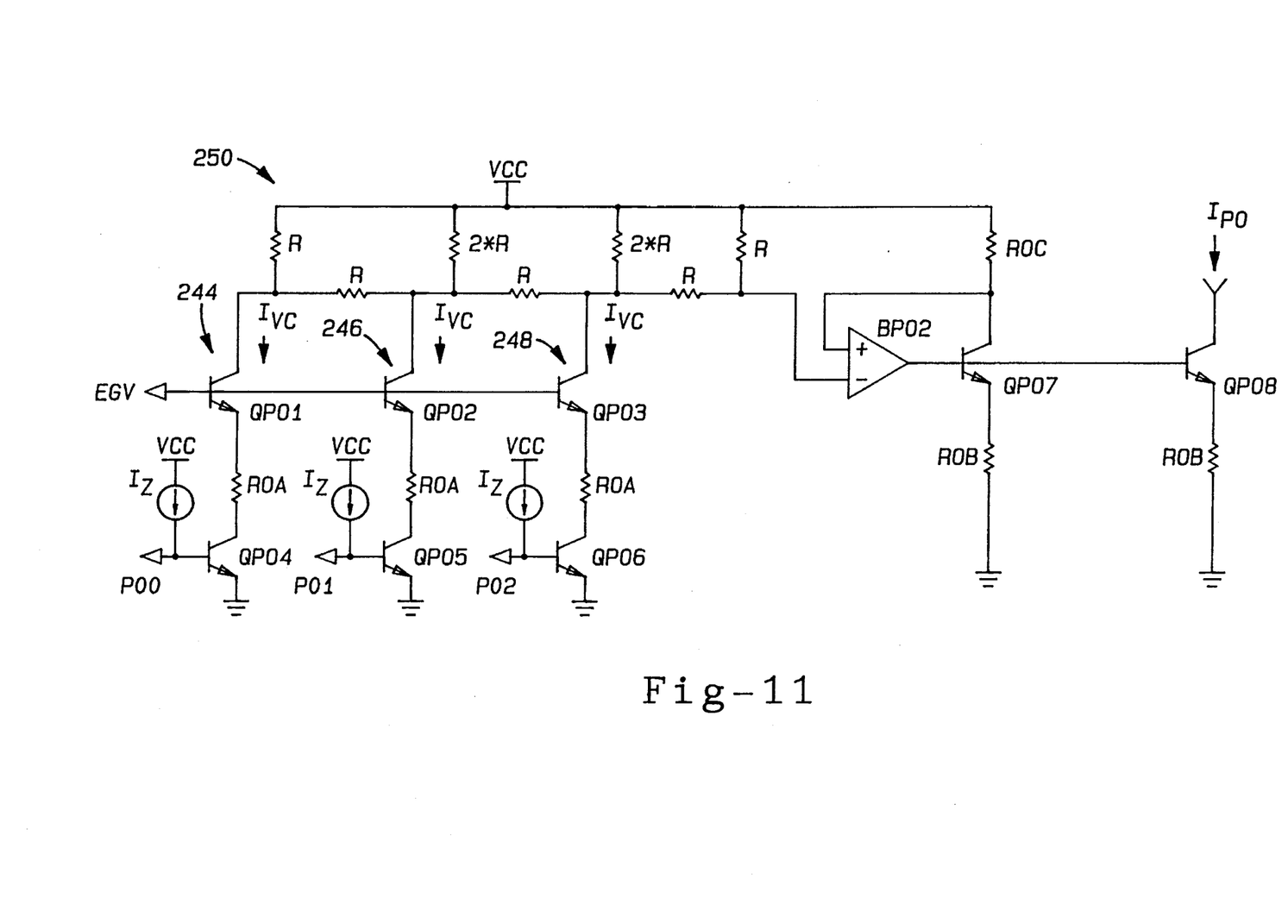
FIG. 11 is a circuit diagram illustrating the circuitry contained within block (H) of FIG. 7 in accordance with the present invention.

Referring to FIG. 11, the circuitry contained within the primary offset code block 178 is illustrated. The primary offset current $I_{PO}$ is an adjustable binary weighted current. The primary offset current $I_{PO}$ represents the current generated by parallel binary weighted switched current sources 244, 246 and 248. The binary weighted switched current sources 244–248 include transistors QP01–QP06 and resistors ROA. Each of the parallel binary weighted switched current sources 244–248 conducts an amount of equal current $I_{VC}$. Additionally, each of the binary weighted switched current sources 244–248 are coupled to a R-2R resistor network 250 to provide for binary adjustment of the primary offset current $I_{PO}$. As will be apparent to one skilled in the art from this disclosure, binary switched current sources 244–248 operate in substantially the same manner as binary weighted switched current sources 200–206 of FIG. 9. The difference being that the bases of transistors QP04–QP06 include programmable inputs P00–P02, respectively. In order to adjust the primary offset current $I_{PO}$ in a binary manner, memory cells P00–P02 are selectively programmed in accordance with the aforementioned memory programming in order to source currents $I_Z$. The primary offset current $I_{PO}$ may be represented by the following equation:

$$I_{PO}=(R/ROC)*(I_{VC}/3)*(P02+P01/2+P00/4),$$

where each of programmable inputs P00–P02 has a binary value of "1" if a respective memory cell has been programmed and a binary value of "0" if the respective memory cell has not been programmed. Therefore, as will be apparent to one skilled in the art, the primary offset current $I_{PO}$ may be weighted in a binary manner by the selective programming of respective memory cells in order to source current $I_Z$.

Figure 12:
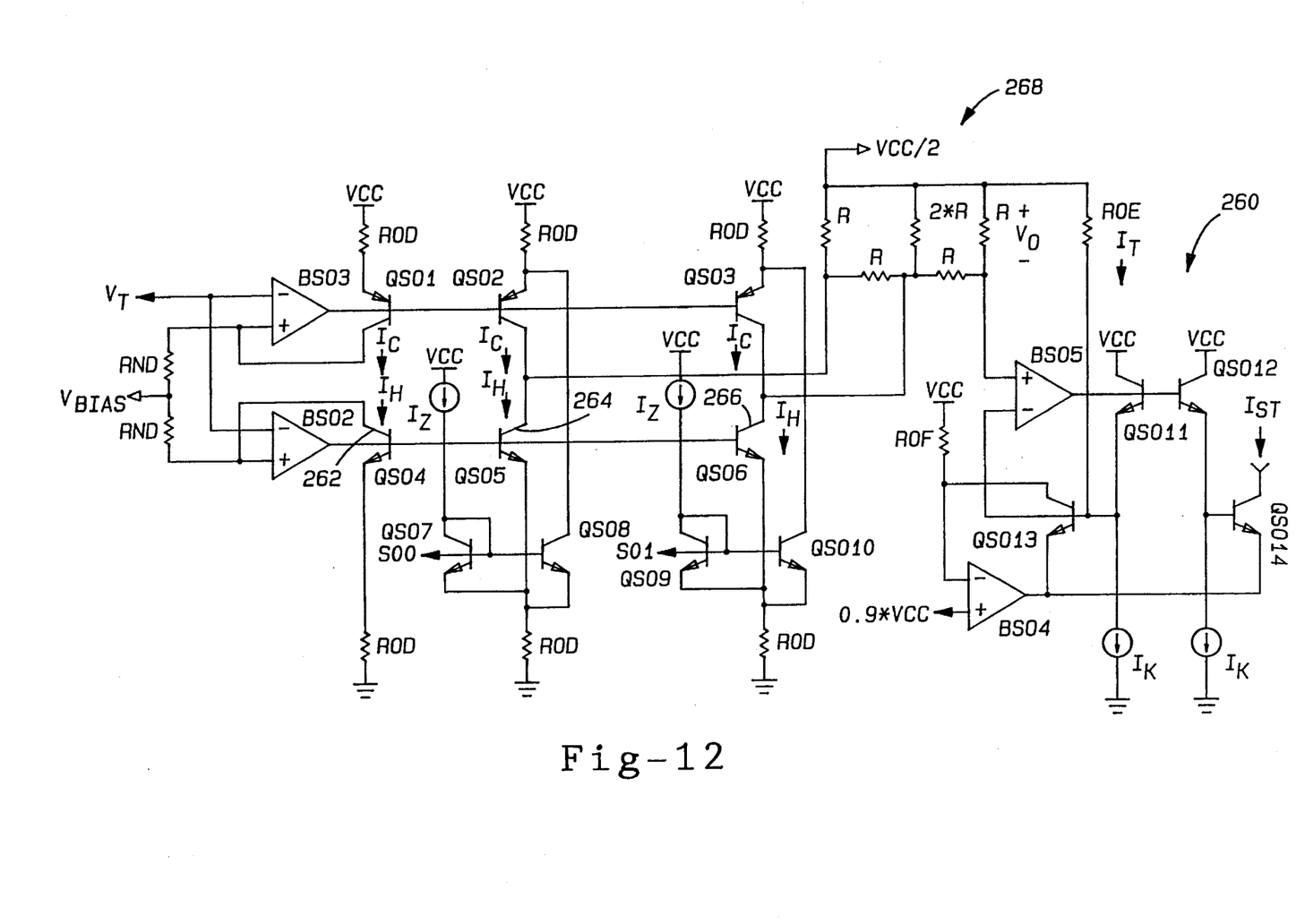
FIG. 12 is a circuit diagram of the circuitry contained within block (I) of FIG. 7 in accordance with the present invention.

Turning now to FIG. 12, the circuitry contained within the secondary offset code block 180 is illustrated therein. The secondary offset current $I_{ST}$ exiting the secondary offset code block 180 may be represented by the following equation:

$$I_{ST}=(Vcc-0.9*Vcc)*(1-I_T/I_K)/ROF,$$

where current $I_K$ is a voltage Vcc independent current source. The transistors QSO11–QSO14 and operational amplifiers BSO4 and BSO5 are connected so as to provide a signal multiplier for producing the secondary offset current $I_{ST}$ in a manner which is similar to that of the secondary gain code block 174. In operation, a temperature dependent binary weighted current $I_T$ is generated for providing the temperature dependence for the secondary offset current $I_{ST}$. The output voltage $V_T$ from the temperature compensation null code block 176 is provided to the inverting (−) inputs of operation amplifiers BSO2 and BSO3.

When the difference between bias voltage $V_{BIAS}$ and output voltage $V_T$ is greater than zero, the operational amplifier BSO2 forces a current $I_H$ equal to $[(V_{BIAS}-V_T)/RND]$ to be injected into the collector 262 of transistor QSO4. Transistors QSO4, QSO5 and QSO6 along with resistors ROD form a standard current mirror. Programmable inputs SO0 and SO1 are connected to the bases of transistors QSO7 and QSO9 for receiving the TC offset code binary signals from memory cells SO0 and SO1. Assuming that programmable inputs SO0 and SO1 are grounded by the TC offset code binary signals, the current $I_H$ will be mirrored to the collectors 264 and 266 of transistors QSO5 and QSO6, respectively. This forces transistors QSO7 through QSO10 into cutoff mode and therefore have no effect on the current mirror operation. Because the difference between bias voltage $V_{BIAS}$ and voltage $V_T$ is greater than zero, the operation amplifier BSO3 will operate in a voltage comparator mode and force transistor QSO1 into cutoff and also force current $I_C$ to equal zero. A standard R-2R ladder 268 which is coupled to a voltage source Vcc/2 extracts the current $I_H$ from transistors QSO5 and QSO6. This results in the generation of a binary weighted voltage $V_O$. Therefore, via the operational amplifier BSO5 and resistor ROE, the current $I_T$ could be expressed by the following equation:

$$I_T=(R/ROE)*(I_H/3)*(SO1+SO0/2),$$

where SO1 and SO0 represent the programmed status of the programmable inputs SO0 and SO1.

When the difference between bias voltage $V_{BIAS}$ and voltage $V_T$ is less than zero, a parallel explanation for the generation current $I_C$ through transistors QSO1, QSO2, and QSO3 similarly follows the above description for the generation of the current $I_H$ and its resulting effect on current $I_T$. Therefore, the current $I_T$ may be represented by the following equation:

$$I_T=-(R/ROE)*(I_C/3)*(SO1+SO0/2).$$

Again, it will be apparent that depending on the programmed status of the programmable inputs SO0 and SO1, the current $I_T$ may be selectively weighted in a binary weighted manner. It should also be appreciated that operational amplifiers BSO2 and BSO3 and resistors RND may be represented by the operational amplifier BSO23 and the resistor RND of FIG. 10. As such, the current $I_{TC}$ as described in connection with FIG. 10 may be represented by the following equation:

$$I_{TC} = I_H - I_C, \text{ where}$$
$$= I_H - 0 \text{ for } V_{BIAS} - V_T > 0$$
$$= 0 - I_C \text{ for } V_{BIAS} - V_T < 0.$$

Therefore, by combining the above two equations for $I_T$ and substituting the current $I_{TC}$, current $I_T$ may now be represented by the following equation:

$$I_T=(R/ROE)*(I_{TC}/3)*(SO1+SO0/2).$$

If $I_{TC}$ in the above equation is replaced with the equation that was derived for the current $I_{TC}$ in connection with FIG. 10, current $I_T$ may now be represented by the following equation:

$$I_T=(R/ROE)*[K_o*\Delta T/(3*RND*TO)]*(SO1+SO0/2).$$

The current $I_T$ will vary as a function of temperature due to the $\Delta T$ term. Therefore, because the current $I_{TC}$ was nulled at the first operating temperature T, the current represented by the above equation will also be nulled at the first operating temperature T. Therefore, the secondary offset current $I_{ST}$ as represented in the aforementioned equation, will have a temperature dependent effect on the voltage $V_{OUT}$ which will appear at output line 116.

Figure 13:
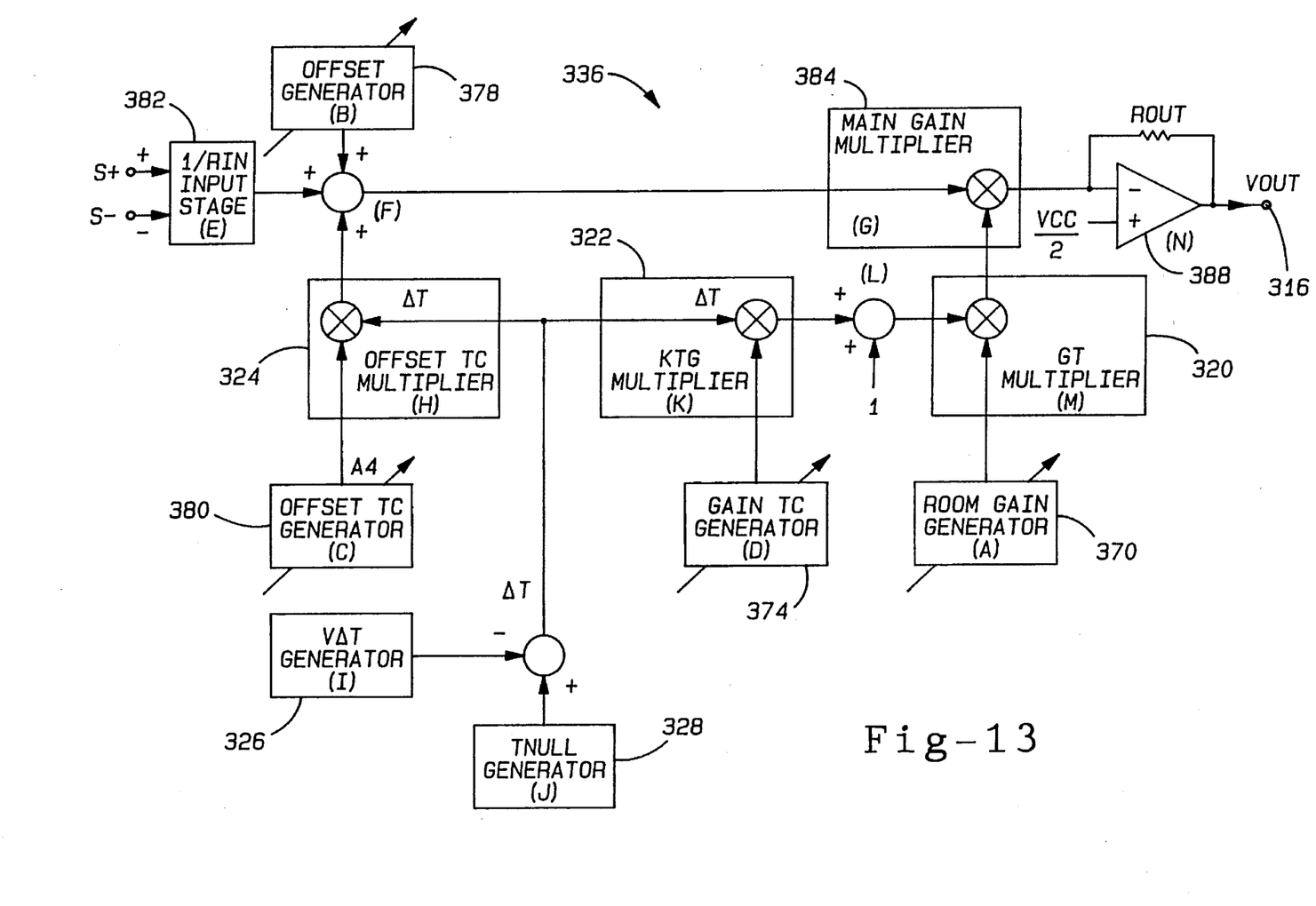
FIG. 13 is a block diagram illustrating a second embodiment of the overall programmable transducer amplifier circuit for use with an accelerometer transducer.

According to FIG. 13, an alternate embodiment of the overall programmable transducer amplifier circuit 336, specifically designed for use with an accelerometer transducer, is shown.

The amplifier circuit 336 is constructed similar to the amplifier circuit 36 for the pressure transducer application. Generally speaking, amplifier 336 includes a number of digitally programmable control blocks which are designed to receive binary coded signals for adjusting operating characteristics of the amplifier circuit 336 and/or accelerometer transducer through various temperature changes.

More specifically, amplifier 336 includes an input stage 382 for receiving the differential voltage outputs S+ and S− from an accelerometer transducer. An offset generator 378 adjusts for offset characteristics, while offset temperature compensation (TC) generator 380 along with offset TC multiplier 324 provide additional offset calibration. A voltage generator 326 and temperature null generator 328 provide null adjustments in response to temperature changes. A gain TC generator 374 in combination with multiplier 322 provides gain calibration adjustment.

Also included with amplifier circuit 336 is a room gain generator 370, which in combination with multiplier 320 provides initial gain calibration. A main gain multiplier 384 feeds an operational amplifier 388. Operational amplifier 388 in turn generates the output voltage $V_{OUT}$ at output 316. The accelerometer amplifier circuit 336 as provided in FIG. 13 illustrates that calibration of amplifier and transducer characteristics may be adjusted depending on changes in operating temperature. This is generally accomplished in a manner similar to that disclosed in connection with the amplifier circuit 36 which was designed for use with the pressure transducer according to the first embodiment. It should be understood that the gain control blocks provided in circuit 336 are generally configured in a manner similar to the circuit diagrams provided in connection with circuit 36. However, modifications may be necessary in order to implement the control blocks shown in 336. Additionally, it should be appreciated that the teachings of the present invention are likewise applicable to other types of transducer applications.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A programmable integrated amplifier circuit, said programmable integrated amplifier circuit being independently programmable at a first operating temperature and at a second operating temperature for adjusting operating characteristics of said amplifier circuit, said circuit comprising:

binary adjustable circuit means for adjusting the operating characteristics of said amplifier circuit in a temperature independent and dependent manner; and a plurality of binary coded signals received by said binary adjustable circuit means for programming said binary adjustable circuit means at said first operating temperature in a temperature independent manner and at said second operating temperature in a temperature dependent manner in order to adjust the operating characteristics of said amplifier circuit, whereby adjusting the operating characteristics of said amplifier at said first operating temperature is independent of the adjusting of the operating characteristics of said amplifier circuit at said second temperature.

2. The programmable integrated amplifier circuit of claim 1 further comprising:

electronically programmable memory circuit array means having a plurality of outputs for supplying said binary coded signals to said binary adjustable circuit means.

3. A programmable integrated amplifier circuit, said programmable integrated amplifier circuit being independently programmable at a first operating temperature and at a second operating temperature for adjusting the operating characteristics of said amplifier circuit, said circuit comprising:

primary circuitry for adjusting the operating characteristics of said amplifier circuit in a temperature independent manner;

secondary circuitry for adjusting the operating characteristics of said amplifier circuit in a temperature dependent manner; and electronically programmable memory circuit array means having a plurality of outputs for supplying a plurality of binary coded signals to, said primary circuitry and said secondary circuitry, whereby at said first operating temperature, said secondary circuitry is nulled and said primary circuitry adjusts the operating characteristics of said amplifier, and at said second operating temperature, said secondary circuitry also adjusts the operating characteristics of said amplifier.

4. The programmable integrated amplifier circuit of claim 3 further comprising:

a temperature dependent voltage generator circuit operatively coupled to said secondary circuitry and having adjustable null voltage capability at said first operating temperature, said voltage generator circuit generates an output voltage which is proportional to changes in operating temperature from said first operating temperature, said temperature dependent voltage generator circuit supplying said output voltage to said secondary circuitry such that said secondary circuitry is nulled at said first operating temperature.

5. The programmable integrated amplifier circuit of claim 4, wherein said temperature dependent voltage generator circuit includes:

binary weighted switched current source means for producing an adjustable binary weighted current, whereby said binary weighted switched current source means is adjustable at said first operating temperature so as to null said output voltage.

6. A programmable integrated amplifier circuit, said programmable integrated amplifier circuit being independently programmable at a first operating temperature and at a second operating temperature for adjusting operating characteristics of said amplifier circuit, said circuit comprising:

binary adjustable circuit means for adjusting the operating characteristics of said amplifier circuit, said binary adjustable circuit means including a plurality of binary weighted switched current sources; and a plurality of binary coded signals received by said plurality of binary weighted switched current sources for producing a plurality of adjustable binary weighted currents for independently programming said binary adjustable circuit means at said first and at second operating temperatures in order to adjust the operating characteristics of said amplifier circuit, whereby adjusting the operating characteristics of said amplifier at said first operating temperature is independent of the adjusting of the operating characteristics of said amplifier circuit at said second temperature.

7. The programmable integrated amplifier circuit of claim 6, wherein said plurality of binary weighted switched current sources each include at least one current source and at least one electronic switch, whereby said at least one electronic switch selectively couples said at least one current source to one of said plurality of adjustable binary weighted currents in response to one of said plurality of binary coded signals for weighting said one of said plurality of binary weighted currents.

8. A programmable integrated amplifier circuit, said programmable integrated amplifier circuit being independently programmable at a first operating temperature and at a second operating temperature for adjusting operating characteristics of said amplifier circuit, said circuit comprising:

primary circuitry for adjusting the operating characteristics of said amplifier circuit in a temperature independent manner;

secondary circuitry for adjusting the operating characteristics of said amplifier circuit in a temperature dependent manner;

a temperature dependent voltage generator circuit operatively coupled to said secondary circuitry and having adjustable null voltage capability at said first operating temperature, said voltage generator circuit generates an output voltage which is proportional to changes in operating temperature from said first operating temperature, said temperature dependent voltage generator circuit supplying said output voltage to said secondary circuitry such that said secondary circuitry is nulled at said first operating temperature; and electronically programmable memory circuit array means having a plurality of outputs for supplying a plurality of binary coded signals to said primary circuitry, to said temperature dependent voltage generator circuit, and to said secondary circuitry, whereby at said first operating temperature, said secondary circuitry is nulled and said primary circuitry adjusts the operating characteristics of said amplifier, and at said second operating temperature, said secondary circuitry also adjusts the operating characteristics of said amplifier.

9. The programmable integrated amplifier circuit of claim 8, wherein said primary circuitry, said temperature dependent voltage generator circuit, and said secondary circuitry include a plurality of binary weighted switched current sources receiving said binary coded signals for producing a plurality of adjustable binary weighted currents.

10. The programmable integrated amplifier circuit of claim 9, wherein said plurality of binary weighted switched current sources each include at least one current source and at least one electronic switch, whereby said at least one electronic switch selectively couples said at least one current source to one of said plurality of adjustable binary weighted currents in response to one of said plurality of binary coded signals for weighting said one of said plurality of binary weighted currents.

11. A method of programming a programmable integrated amplifier circuit, said method comprising the steps of:

operating said amplifier circuit at a first operating temperature;

adjusting a first binary weighted switched current source of a temperature dependent voltage generator circuit at said first operating temperature for producing a first binary weighted current so as to null an output voltage of said temperature dependent generator circuit;

supplying the output voltage of said temperature dependent voltage generator to a secondary circuitry so as to null said secondary circuitry; and adjusting a second binary weighted switched current source of a primary circuitry at said first operating temperature for producing a second binary weighted current in order to adjust the operating characteristics of said amplifier.

12. The method of claim 11, further comprising the steps of:

operating said amplifier circuit at a second operating temperature; and adjusting a third binary weighted switched current source of said secondary circuitry at said second operating temperature for producing a third binary weighted current so as to further adjust the operating characteristics of said amplifier.

13. The method of claim 11, wherein said step of adjusting said first binary weighted switched current source includes the step of:

closing a first electronic switch for coupling a first current source of a series of current sources to said first binary weighted current, whereby said first current source provides current for weighting said binary weighted current.

14. The method of claim 11, wherein said step of adjusting said second binary weighted switched current source includes the step of:

closing a first electronic switch for coupling a first current source of a series of current sources to said second binary weighted current, whereby said first current source provides current for weighting said second binary weighted current.

15. The method of claim 12, wherein said step of adjusting said third binary weighted switched current source includes the step of:

closing a first electronic switch for coupling a first current source of a series of current sources to said third binary weighted current, whereby said first current source provides current for weighting said third binary weighted current.

16. The method of claim 13, wherein said step of adjusting said first binary weighted switched current source further includes the step of:

closing a second electronic switch for coupling a second current source of said series of current sources to said first binary weighted current, whereby said second current source provides current for further weighting said first binary weighted current.

17. The method of claim 14, wherein said step of adjusting said second binary weighted switched current source further includes the step of:

closing a second electronic switch for coupling a second current source of said series of current sources to said second binary weighted current, whereby said second current source provides current for further weighting said second binary weighted current.

18. The method of claim 15, wherein said step of adjusting said third binary weighted switched current source further includes the step of:

closing a second electronic switch for coupling a second current source of said series of current sources to said third binary weighted current, whereby said second current source provides current for further weighting said third binary weighted current.

19. The programmable integrated amplifier circuit of claim 1, wherein said binary adjustable circuit means include:

primary circuitry for adjusting the operating characteristics of said amplifier circuit in a temperature independent manner; and secondary circuitry for adjusting the operating characteristics of said amplifier circuit in a temperature dependent manner, whereby said binary coded signals are received by said primary circuitry and said secondary circuitry such that at said first operating temperature, said secondary circuitry is nulled and said primary circuitry adjusts the operating characteristics of said amplifier, and at said second operating temperature, said secondary conditioning circuitry also adjusts the operating characteristics of said amplifier.

20. The programmable integrated amplifier circuit of claim 19 further comprising:

a temperature dependent voltage generator circuit operatively coupled to said secondary circuitry and having adjustable null voltage capability at said first operating temperature, said voltage generator circuit generates an output voltage which is proportional to changes in operating temperature from said first operating temperature, said temperature dependent voltage generator circuit supplying said output voltage to said secondary circuitry such that said secondary circuitry is nulled at said first operating temperature.

21. The programmable integrated amplifier circuit of claim 20, wherein said temperature dependent voltage generator circuit includes:

binary weighted switched current source means for producing an adjustable binary weighted current, whereby said binary weighted switched current source means is adjustable at said first operating temperature so as to null said output voltage.

22. The programmable integrated amplifier circuit of claim 1, wherein said binary adjustable circuit means includes a plurality of binary weighted switched current sources receiving said plurality of said binary coded signals for producing a plurality of adjustable binary weighted currents.

23. The programmable integrated amplifier circuit of claim 22, wherein said plurality of binary weighted switched current sources each include at least one current source and at least one electronic switch, whereby said at least one electronic switch selectively couples said at least one current source to one of said plurality of adjustable binary weighted currents in response to one of said plurality of binary coded signals for weighting said one of said plurality of binary weighted currents.

* * * * *